United States Patent [19]

Flint

[11] 3,766,046

[45] Oct. 16, 1973

[54] JIG HOLDER FOR CLAMPING ARTICLES IN PLACE DURING TREATMENT THEREOF

[75] Inventor: Alan G. Flint, San Jose, Calif.

[73] Assignee: Industrial Modular Systems Corporation, Santa Clara, Calif.

[22] Filed: Mar. 23, 1972

[21] Appl. No.: 237,409

[52] U.S. Cl. .......... 204/297 W
[51] Int. Cl. .......... B23p 1/02
[58] Field of Search .......... 204/297 W

[56] References Cited

UNITED STATES PATENTS

| | | | |
|---|---|---|---|
| 2,475,434 | 7/1949 | Moss | 204/297 W |
| 2,721,839 | 10/1955 | Taylor | 204/297 W |
| 3,347,771 | 10/1967 | Reznick et al. | 204/297 W |

*Primary Examiner*—F. C. Edmundson
*Attorney*—Paul D. Flehr et al.

[57] ABSTRACT

Improved apparatus for holding and positioning a plurality of articles, such as silicon wafers utilized in manufacturing electronic devices, during electrolytic etching. The apparatus comprises a jig holder for positioning one or more article carriers therein and includes means for insuring electrical contact between the jig holder and the individual articles to insure effective electrolytic etching. Use of article carriers obviates individual handling of articles so that a large number of articles may be easily and rapidly positioned in place in electrical contact with the jig holder.

The jig holder includes improved means for insuring electrical contact between the articles and the holder, such means including contact structure for selectively cutting through a film coating normally carried on the articles being etched. Such electrical contact structure firmly grips the individual articles so that article displacement is positively precluded, and article damage is thereby obviated, during movement of the jig holder relative to an electrolytic bath or other system.

19 Claims, 8 Drawing Figures

JIG HOLDER FOR CLAMPING ARTICLES IN PLACE DURING TREATMENT THEREOF

BACKGROUND OF THE INVENTION

1. Field of the Invention

This invention relates to the field of manufacture of semiconductor devices, such as integrated circuits and other devices commonly produced in the electronics industry. Silicon or like wafers are commonly coated with an aluminum or like film deposited thereon, such coating providing the electrical circuitry for the devices ultimately manufactured. Such aluminum film is commonly coated with a layer of photoresist material of known type which protects the aluminum in those areas where the aluminum is not to be selectively removed. In those areas where the photoresist material is removed in known fashion, the exposed aluminum is chemically treated, normally in an electrolytic etching procedure, by positioning the wafers in an electrolytic bath defined by known etching liquids, such as sodium hydroxide and phosphoric acid.

This invention further relates to the field of holders for wafers to be inserted into an electrolytic bath so that the exposed areas of aluminum film may be etched away in accordance with known procedures as one step in the manufacture of electronic devices of the type noted. Holders for such wafers known heretofore have generally required the individual insertion and removal of wafers relative to the holder in a manual operation which is time consuming and conducive to wafer damage.

Accordingly, there has developed an important need for an improved holder for wafers during electrolytic etching thereof which facilitates wafer insertion and removal into the holder and which insures effective clamping of the wafers during the etching process in a manner heretofore unknown with existing equipment. The present invention is directed to the field of improved jig holders for wafers which facilitates wafer positioning within the holder and insures effective electrical contact between the individual wafers and the holder so that effective electrolytic etching is insured. The field of this invention has other applicability, however, in conjunction with treatment of articles which require secure clamping thereof during treatment or handling.

2. Description of the Prior Art

So far as is known, the particular jig holder for devices, such as silicon and like wafers being processed into electronic devices, of the type disclosed herein has been unknown heretofore. So far as is known, holders for devices to be electrically etched have required the manual insertion and removal of individual articles into the holder.

Additionally, prior known holders have not included improved contact structure of the type disclosed herein which insures effective electrical contact between the holder and the individual articles which cuts through the coating of photoresist material commonly utilized to cover the aluminum or like film applied to the articles being electrolytically etched. For example, it has been known heretofore to utilize a holder employing a retractable rod surrounded by a coil spring between the convolutions of which wafers may be selectively positioned individually in a manual operation. Such positioning of individual articles in the convolutions of a coil spring requires not only the time consuming and possibly damaging manual insertion and removal of articles from such convolutions when the spring is extended, but has the further disadvantage of failing to insure effective electrical contact between the individual articles and the holder which is necessary to insure effective electrolytic etching.

Accordingly, with the jig holder of the present invention, quantities of devices to be electrolytically etched may be inserted into the holder into secure clamping engagement with electrical contact structure provided therein, without requiring individual handling of the wafers and in a manner which insures effective electrical contact of each wafer with the electrical contact structure of the holder.

SUMMARY OF THE INVENTION

This invention relates to an improved jig holder for clamping articles securely therein for handling and treatment. More particularly, this invention relates to an improved jig holder for articles to be electrolytically etched,such as silicon or like wafers commonly utilized in the production of electronic devices, such as integrated circuits and the like. Still more particularly, this invention relates to an improved jig holder including improved electrical contact structure which permits the insertion of quantities of articles, such as silicon wafers, into engagement therwith simultaneously and without requiring individual manual handling of the wafers during such insertion.

Still more particularly, this invention relates to an improved jig holder for use in conjunction with an electrolytic etching process for semiconductor wafers and like articles which includes structure for accepting quantities of wafers simultaneously thereinto, such wafers being carried in a wafer carrier and oriented therin in accordance with the construction of the electrical contact structure of the holder, so that effective electrical contact is insured and the need for individual manual handling of wafers to be electrolytically etched is obviated.

This invention further relates to an improved jig holder for use in conjunction with electrolytic etching apparatus which accommodates one or more article carriers therein, each such carrier being adapted to receive and position a plurality of articles to be electrolytically etched in proper orientation for engagement with electrical contacts in the holders without requiring separation of the individual articles from the carrier. Additionally, this invention relates to an improved jig holder which includes improved electrical contact structure in conjunction therewith for insuring effective electrical contact with the articles by cutting through a protective coating, such as a layer of photoresist material, carried on the articles.

From the foregoing,it should be understood that objects of this invention include the provision of an improved jig holder for use in securely clamping a series of articles therein, particularly when used in conjunction with a system for electrolytically etching such articles; the provision of an improved jig holder for an electrolytic etching apparatus which permits a plurality of articles to be simultaneously positioned in electrical contact with the holder; the provision in an electrolytic etching jig holder of improved electrical contact structure which insures stripping or cutting through of a protective film carried by the articles to be etched so that effective electrical contact is insured; and the provision of an improved jig holder for articles to be electrolytically etched which accommodates directly therein one or more carriers, each of which accommodates a plurality of articles to be electrolytically etched therein, so that such articles are automatically positioned in alignment with electrical contact structure of the holder so that manual handling of individual articles during insertion or removal of the articles relative to the holder prior to and following electrolytic etching is obviated.

These and other objects of this invention will become apparent from a study of the following disclosure taken in conjunction with the attached drawings.

DESCRIPTION OF THE PREFERRED EMBODIMENT

Before describing details of the improved jig holder of the present invention, reference will be directed generally to the procedure for electrolytic etching articles in which the subject jig holder is advantageously employed. In the manufacture of semiconductor or other electronic devices, such as integrated circuits and the like, it is necessary to selectively remove certain portions of a film coating, such as an aluminum film, which has been deposited on a silicon or like wafer from which the devices are to be produced. A layer of known photoresist material also is commonly applied over the aluminum or other film applied to the wafer to protect the aluminum film in those areas where it is not desired to remove the same.

By selectively removing certain areas of photoresist material to expose the aluminum film lying therebeneath, such exposed aluminum film areas may be removed chemically in an electrolytic etch operation which employs a known etching bath, such as sodium hydroxide or phosphoric acid, by way of example.

Such etching bath normally is positioned in a tank and the etch solution thus serves as the electrolyte. An electrode assembly is provided in conjunction with the tank which includes first and second electrodes which are disposed in contact with the etching solution. One of such electrodes is defined by a jig holder for the articles to be etched.

When one or more articles, such as silicon wafers, are positioned in a holder located in the etch solution and electric current is passed therethrough, each wafer is selectively etched in accordance with the pattern of removed photoresist material covering the aluminum or like film thereon. Such an etching procedure is well known and details thereof will not be described further herein as they form no part of this invention.

With prior known etching systems, however, holders for the silicon or like wafers to be etched had inherent disadvantages in that they required individual insertion and removal of articles to be etched relative to the holder, which frequently resulted in article damage or breakage. Additionally, prior known holders had no capability for insuring effective electrical contact between the wafers and the holder.

With the present invention, an improved jig holder for a plurality of wafers to be etched is provided which obviates the need for individual manual handling of the wafers during insertion or removal thereof from the holder, and which further includes improved electrical contact structure which insures stripping or removal of the photoresist material from the individual wafers in the area of their contact with the electrical contact structure so that effective current flow through the individual wafers during the electrolytic etching operation is insured.

Figure 1:
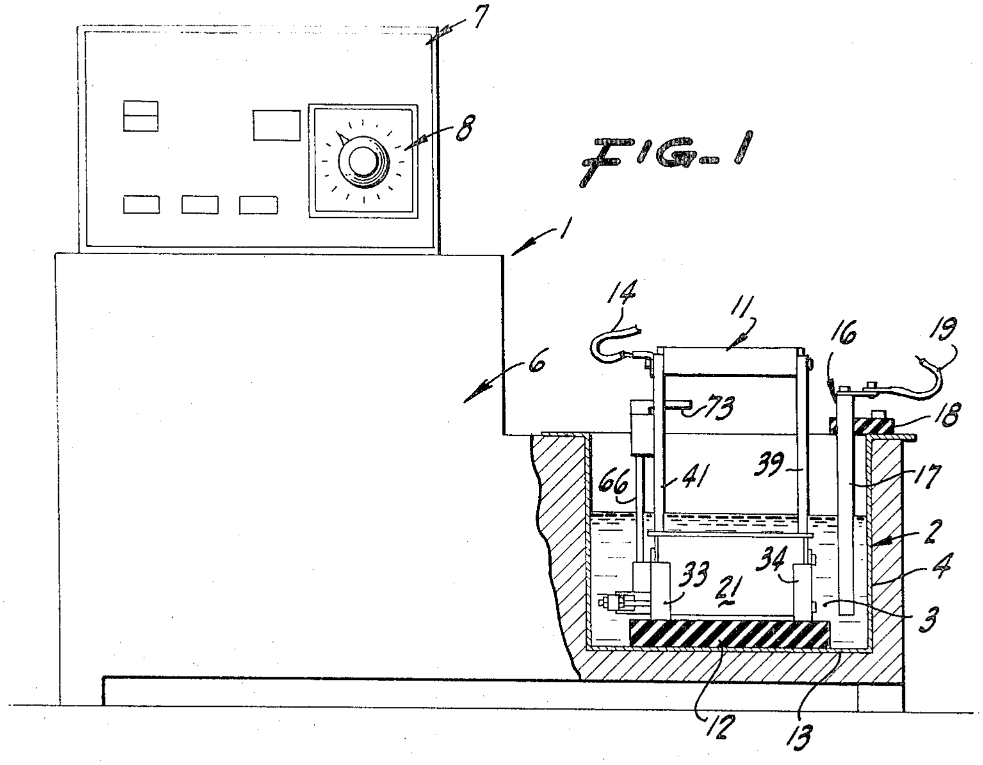
FIG. 1 is a generally schematic view of an electrolytic etching system showing the subject jig holder operatively positioned therein.

Referring first to FIG. 1, a generally schematic illustration of one example of an electrolytic etch apparatus and system is presented. Such system, generally designated 1, includes an open tank, generally designated 2, in which is positioned a quantity of electrolytic etching fluid 3, such as phosphoric acid, sodium hydroxide, or some other known etching material. The tank 2 in the illustrated embodiment is defined by a rectangular upright wall structure 4 and is formed of any suitable material which is resistant to the chemical effects of the electrolytic bath 3 contained therein, such as stainless steel.

The tank 2 is positioned within a chamber or receptacle of suitable size formed in an insulating parent body 6 which may be formed from a suitable plastic, such as polypropylene. A control console, generally designated 7 and including an electric current setting dial 8 thereon, is positioned adjacent the tank for regulating operation of the system and controlling the electric current which flows through the electrolytic bath in the tank and the means for positioning the articles, such as silicon wafers, to be etched therein.

Hereinafter, reference is directed specifically to the etching of silicon wafers utilized in the manufacture of electronic devices of the type noted previously. However, it should be understood that this invention has utility in conjunction with the electrolytic etching or other treatment of other articles, and reference herein to the etching of silicon wafers should not be considered as limiting on the scope of the present invention.

The wafers to be etched are positioned within the tank by utilizing the improved jig holder of this invention, which is generally designated 11. Such jig holder is selectively positionable within the tank 2 and is insulated therefrom when so positioned by means of a base plate 12 of suitable non-conducting material, such as a supporting plate of Teflon positioned in the bottom of the tank and resting on the base 13 thereof. Thus, when the wafer jig holder is positioned as shown in FIG. 1, it is held out of contact with the stainless steel tank by means of the base plate 12.

The jig holder is provided with a separable electrical connection defined by an electrical wire 14 removably engaged with the holder in the manner to be described. Wire 14 is operatively connected with the control console 7 in known fashion. Thus, the jig holder defines one of the electrodes, namely the anode, of the electrolytic etch system illustrated when the same is electrically connected with the control console through wire 14.

The second electrode, namely the cathode, of the system is defined by the etch solution in conjunction with another electrode operatively positioned in the electrolytic bath. In the embodiment illustrated, such other electrode is defined by a structure, generally designated 16, which includes an elongated rod 17 positioned to depend into the electrolytic bath in the manner seen in FIG. 1. Such rod 17 is insulated from the tank 2 by means of an insulator mounting plate 18 of suitable plastic, such as Teflon. The electrode rod is connected with the control console 7 by means of an electrical wire 19 in known fashion.

While in the embodiment illustrated a separate rod 17 is illustrated, it should be understood also that the tank itself may, if desired, be utilized to define the second electrode of the system.

By passing electrical current, properly regulated by dial 8 of the control console 7, through the electrodes defined by the jig holder 11 and the second electrode structure 16, electrolytic etching of wafers positioned within the holder 11 may be effected in the manner known in the art.

As noted, holders for a plurality of wafers to be etched have been known heretofore in the field of semiconductor device manufacture. However, with such prior known wafer holders, individual positioning of wafers in the holders was necessitated and no assurance was had that effective electrical contact between individual wafers and the holder was effected. With the jig holder construction 11 of this invention, individual manual handling of wafers during insertion or removal thereof relative to the electrolytic bath is obviated and effective electrical contact of individual wafers with the electrode defined by the jig holder is insured.

Figure 2:
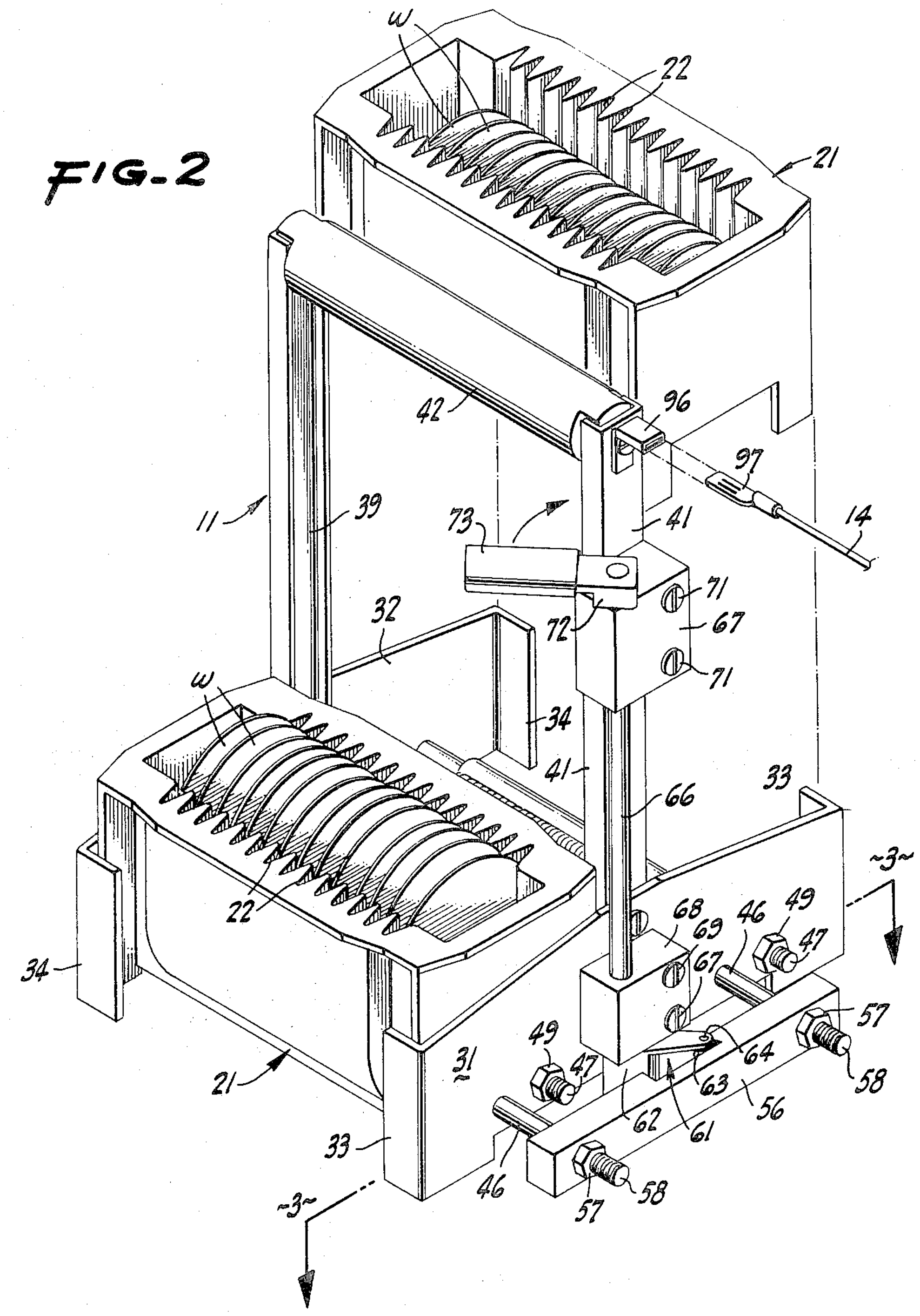
FIG. 2 is an isometric view of the jig holder of the subject invention illustrating positioning of the carriers for articles to be etched relative thereto.

To that end, the present holder is designed to accommodate therein one or more non-metallic carriers for a plurality of wafers so that insertion and removal of a plurality of wafers without individual manual handling may be easily and readily effected. To that end, the illustrated jig holder is designed to accommodate two such wafer carriers therein, each of which is designated 21 in the drawings. It should be understood, however, that the features disclosed herein with respect to the capability of the subject holder to accommodate two such wafer carriers 21 may be expanded to permit accommodation of more than two such carriers in a single holder as desired. Similarly, while the carrier embodiments shown in FIG. 2 illustrate 14 wafers, each designated W, positioned therein, it should be understood that the capacity of the carriers may vary to meet particular needs. In commercial practice such carriers commonly accommodate 25 wafers therein. However, more than or less than 25 wafers may be accommodated in a carrier depending upon the particular system with which the particular carrier is to be utilized.

Figures 3, 4:
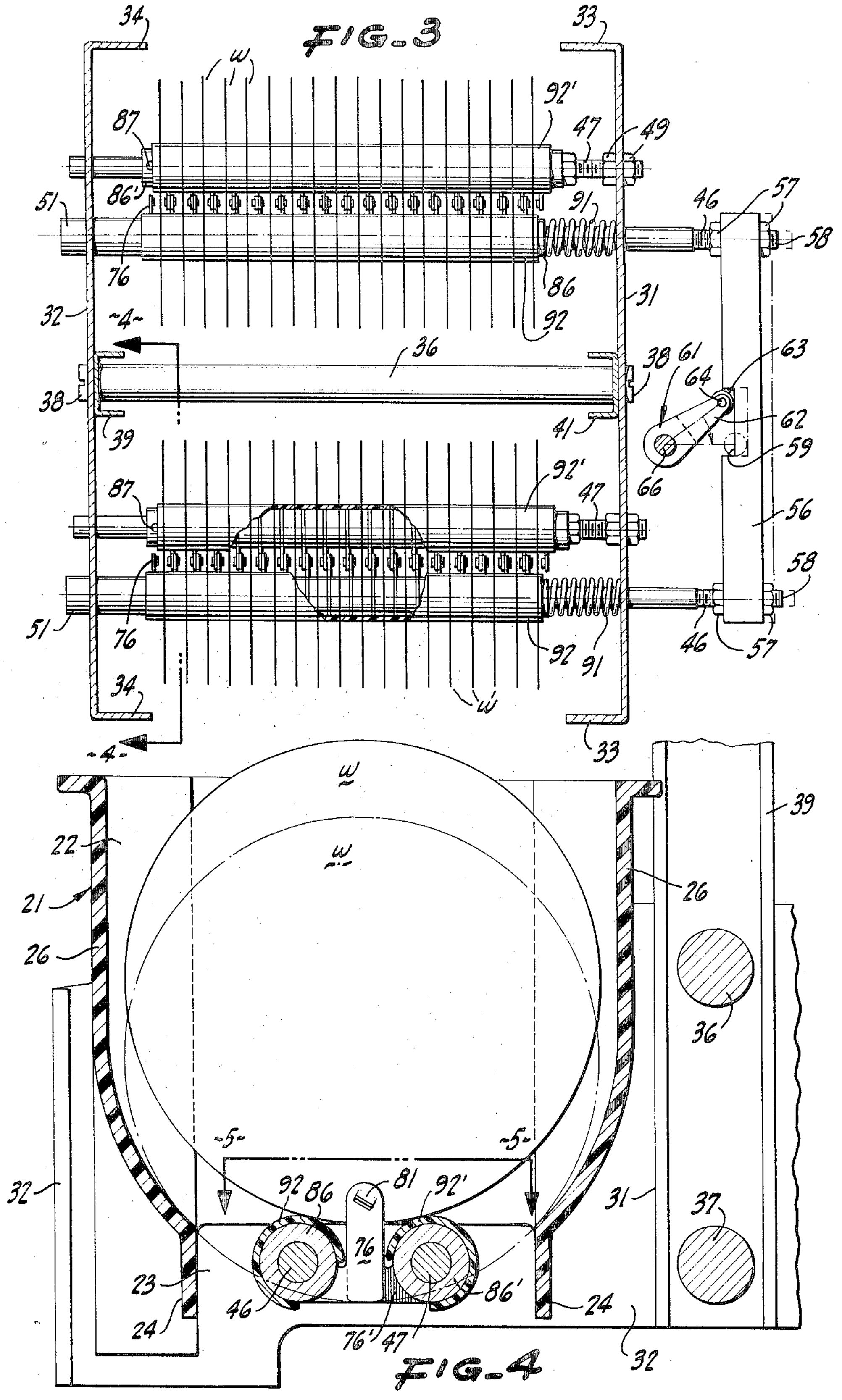
FIG. 3 is a horizontal sectional view through the jig holder taken in the plane of line 3—3 of FIG. 2.
FIG. 4 is a vertical sectional view, on an enlarged scale, through a portion of the jig holder taken in the plane of line 4—4 of FIG. 3.

In that connection, it will be noted that each carrier is molded in one piece from a suitable non-conductive plastic, such as Teflon, and is provided with a series of adjacent V-shaped slots 22 in opposite walls thereof. The number of such slots corresponds to the maximum number of wafers to be accommodated in the carrier. Each such slot, as seen in FIG. 4, terminates in an open bottom 23 defined by a pair of opposed base flanges 24 which extend longitudinally generally the full length of the carrier. Such flanges 24 cooperate with and form extensions of the opposed side walls 26 of the carrier, also as seen in FIG. 4. The open bottom 23 of the carrier allows proper positioning of the carrier into the jig holder so that individual wafers W may be positioned in effective electrical contact with the electrical contact structure of the jig holder in the manner to be described.

It should also be understood that the spacing of the slots 22 of the carrier is such that the individual wafers positioned therein will be laterally spaced from each other in accordance with the lateral spacing of the components of the electrical contact structure so that automatic positioning of individual wafers in conjunction with the electrical contact structure will be insured when a carrier is inserted into a jig holder.

The jig holder, except for those portions thereof mentioned hereafter which are non-conductive, is defined by and produced from material which is electrically conductive, such as stainless steel, so that the same may serve as one electrode of the electrolytic etch system described previously. In that regard, the jig holder is defined by a pair of opposed planar side wall members 31 and 32 which have integral in-turned end flanges 33 and 34, respectively. The side wall members are operatively interconnected with each other by means of a pair of vertically spaced transversely extending metal rods 36 and 37 which are held in operative engagement with the respective side walls 31 and 32 by means of screw fasteners 38 extending through the side walls and threadedly engaged in opposed ends of the respective connecting rods.

Such rods 36 and 37, and their fastening screws 38, also secure a pair of upright channel shaped handle members 39 and 41 to the side walls. At the upper end of the handle members a graspable insulated handle 42 extends transversely thereof. Such handle 42 is formed from a suitable non-metallic material, such as a cylindrical body of Teflon or like material. The handle 42 is secured to the upper ends of the channel shaped handle members 39 and 41 by any suitable means, such as by screws extending longitudinally into the ends of the handle 42 through the handle members 39 and 41. The handle 42 is formed from the material noted to resist corrosion and contamination.

It will be understood from FIG. 2 taken in conjunction with FIG. 4 that the side walls 31 and 32 together with the upright handle members 39 and 41, and the flanges 33 and 34 of the respective side walls, define positioning means comprising a pair of receiving pockets for the wafer carriers 21, as seen in FIG. 2. The dimensions between the opposed side walls 31 and 32, and between the respective flanges 33 and 34 thereof and the adjacent portions of the channel shaped handle members 39 and 41, is such that a wafer carrier is vertically slidably positionable therein in the manner seen in FIG. 2 so that such wafer carrier may be snugly retained therein without lateral or longitudinal shifting during electrolytic etching of the wafers carried therein.

It will be noted from FIG. 4 that the bottom of the jig carrier is generally open between flanges 24, as are the side portions thereof between flanges 33 and 34, so that circulation of electrolytic fluid through the jig holder into contact with the wafers carried in the carriers 21 may be effected. The wafer carriers are positioned and supported in the holder by resting upon supporting structure which extends laterally between the side walls 31 and 32 thereof. Such supporting structure in the illustrated embodiment comprises a pair of parallel side-by-side metal rods 46 and 47, with a pair of such rods being provided in each wafer carrier pocket as best seen in FIG. 3. Such rods comprise part of the electrical contact structure to be described.

Each rod 47 is maintained between the side walls 31 and 32 by means of a pair of nut members 49 threadedly engaged with a threaded end of the rod on opposite sides of side wall 31. Each rod 47 is thus fixedly mounted between the side walls 31 and 32.

Figures 5, 6, 7, 8:
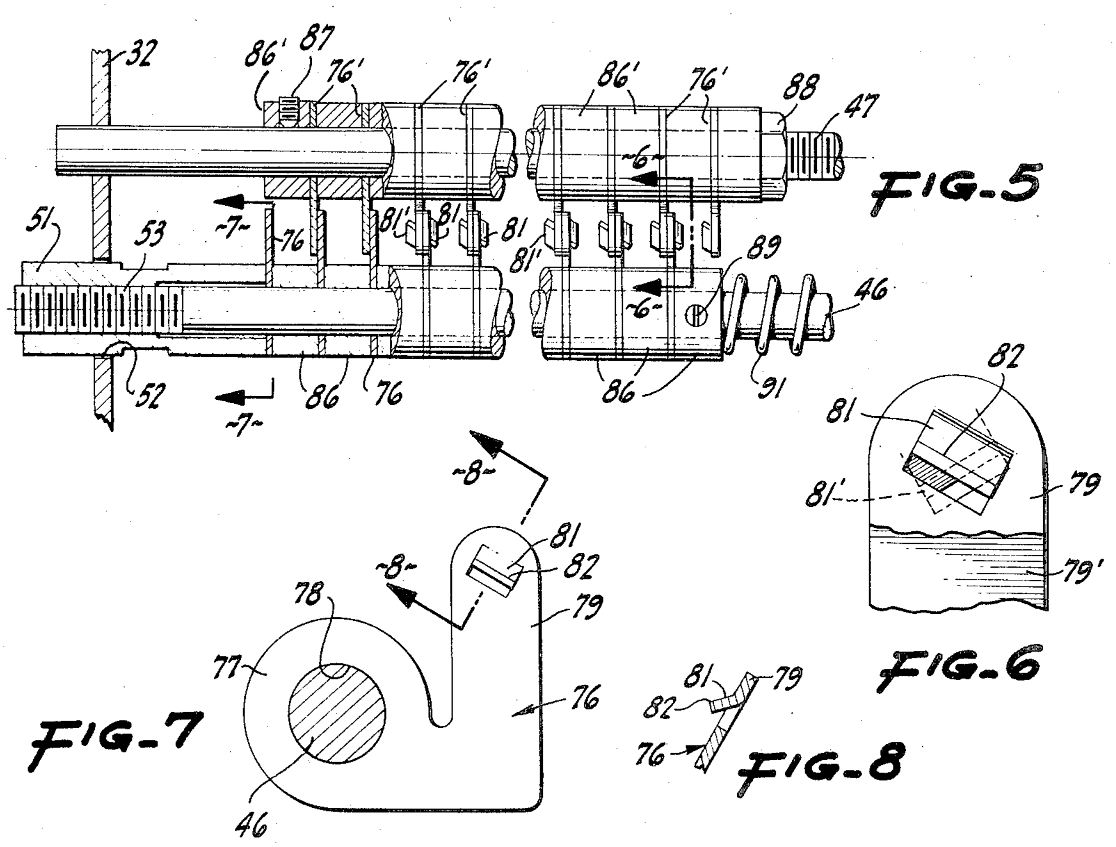
FIG. 5 is a horizontal sectional view of a portion of the jig holder taken in the plane of line 5—5 of FIG. 4 illustrating details of construction of the electrical contact structure thereof.
FIG. 6 is a vertical sectional view through a portion of the electrical contact structure of the jig holder taken in the plane of line 6—6 of FIG. 5.
FIG. 7 is a vertical sectional view through a portion of the electrical contact structure of the jig holder taken in the plane of line 7—7 of FIG. 5 with portions thereof omitted.
FIG. 8 is a generally vertical sectional view through an electrical contact element shown in FIG. 7 taken in the plane of line 8—8 thereof.

As will be described, each of the other rods 46 is positioned for movement along its longitudinal axis, within predetermined limits, between the side walls 31 and 32. To permit such lateral movement, each rod 46 is provided at one end thereof with an internally threaded bearing member 51 which extends through the side wall 32 and is slidable in an opening 52 provided in such side wall as best seen in FIG. 5. Each rod 46 is provided with a threaded end 53 which is threadedly engaged with the bearing 51 as also seen in FIG. 5. Thus, upon movement of a rod 46 along its longitudinal axis, the bearing member 51 is moved by the rod relative to the side wall 32 in accordance with the direction of movement of rod 46. Such movement of rod 46 is effected to produce relative movement between electrical contact members carried by the rods 46 and 47 to bring such members into operative clamping contact with wafers positioned in the jig holder by carriers 21 in the manner to be described hereinafter.

Means is provided in conjunction with the two rods 46 for effecting simultaneous movement thereof relative to the side walls 31 and 32. In the embodiment illustrated, two such rods are provided because two wafer carriers are to be positioned within the jig holder of this invention. It should be understood, however, that the means employed to actuate rods 46 may be used to move a single rod if only one wafer carrier is to be positioned in a jig holder, or to simultaneously move more than two such rods if more than two wafer carriers are to be positioned in a given jig holder.

Such means for selectively moving rods 46 relative to the side walls of the jig holder constitutes a cam mechanism operatively connected with the rods by means of a cam bar 56 (see FIG. 3) which extends between the respective rods and is held in engagement therewith by means of pairs of nut members 57 threadedly engaged with a threaded outer end 58 of the respective rods 46 on opposite sides of the cam bar 56. Intermediate its ends, the cam bar 56 is provided with a recessed camming surface 59 with which a cam structure, generally designated 61, is engaged. Such cam structure includes a bifurcated camming member 62 which carries a cam roller 63 on its outer end, such roller being rotatably mounted between the spaced arms of the camming member by a pin 64.

Thus, by pivoting the bifurcated camming member from the position shown in FIG. 3 towards the right in such figure, the cam bar 56 will be urged laterally outwardly relative to side wall 31 towards the right in FIG. 3 to urge the rods 46 towards the right, that is to move the same laterally of the side walls 31 and 32. The purpose of such movement is to bring the electrical contact members carried by the rods 46 and 47 into clamping contact with wafers positioned therebetween as will be described.

Movement of the camming member 62 from the open position shown in FIGS. 2 and 3 to the closed position is effected by means of a cam shaft 66 which extends vertically of the jig holder and is operatively secured to upright handle member 41 by means of a pair of upper and lower non-metallic pivot blocks 67 and 68 which are secured by suitable screw fasteners 69 and 71, respectively, to holder side wall 31 and to handle member 41 as best seen in FIG. 2. The pivot blocks 67 and 68 are formed from any suitable bearing material, such as Teflon. The operative components of the cam mechanism are defined by any conductive suitable metal, such as stainless steel.

At its upper end, cam shaft 66 is provided with an operating lever 72 formed of any suitable metal, such as stainless steel. A non-metallic sleeve or covering 73 of any suitable material, such as Teflon, is positioned over the operating lever 72 to permit movement of the operating lever and the camming shaft 66 in comfortable fashion by a single finger of the operator of the jig holder.

Thus, it should be understood that by pivoting the operating lever 72 from the position shown in FIG. 2 in the direction of the arrow in such figure, the camming member 62 will be pivoted in the direction of the arrow shown in FIG. 3 to effect movement of the cam bar 56 and attendant lateral movement of the rods 46 in unison for the aforedescribed purpose.

The electrical contact members of the present invention are mounted in opposed fashion on the respective rods 46 and 47 in each of the carrier receiving pockets of the jig holder. In that regard, as best seen from FIGS. 3 through 8, the electrical contact structure includes a plurality of generally d-shaped flat apertured contact members (FIG. 7) all of which are generally identical. The respective contact members mounted on rods 46 and 47 are identified by reference numerals 76 and 76', respectively. The contact members are formed from any suitable conductive metal, such as stainless steel.

Each such contact member 76, as seen in FIG. 7, includes a generally circular extension 77 which includes a circular aperture 78 extending therethrough, such aperture being provided to accommodate rod 46 therethrough as perhaps best seen in FIG. 4. As seen in FIGS. 6 and 7, each contact element 76 further includes an upright generally straight portion 79 which includes a projection defined by a tooth portion 81 struck therefrom. Such projection includes a sharp biting edge 82 intended to engage a wafer positioned adjacent thereto when the cam mechanism of the jig holder is actuated. It will be understood that the purpose of each such biting edge 82 is to cut through or strip away the photoresist material contacted by the edge so that effective electrical contact with the underlying aluminum or like layer carried by the wafer is insured so that effective electrolytic etching can be effected. Contact members 76' are similarly constructed and the corresponding portions thereof are identified by similar reference numerals primed. As noted from FIG. 6, each projecting tooth portion is struck from and projects from its respective contact element at a predetermined angle, approximately 60°, relative to the axis of the upright generally straight portion of the element. Thus, each tooth portion also extends on the bias relative to the transverse axis of the upright portion, at about 30° relative thereto, as shown in FIG. 7. Such inclination insures effective cutting through of the photoresist layer in the manner described.

Referring to FIG. 5, it will be noted that the respective contact elements 76 and 76' are positioned on their associatedrods 46 and 47 in predetermined spaced relationship relative to adjacent elements carried on the same rod. Such spacing is determined generally in accordance with the spacing of the slots 22 formed in the wafer carriers 21. Such spacing is effected by utilizing cylindrical metal spacers 86 and 86' between the respective contact elements 76 and 76'.

A suitable pin or set screw 87 is engaged with the end spacer 86' on each rod 47 and holds the same in a predetermined position on such rod. At the opposite end of rod 47 a threaded nut member 88 is employed to effectively clamp the other spacers 86' and the contact elements 76' in secure engagement between such nut and the first mentioned end spacer as noted in FIG. 5.

The contact elements 76 and spacers 86 mounted on rods 46 are held in place thereon by means of the aforementioned bearing member 51 threadedly engaged with end 53 of each rod 46, and by a set screw or pin 89 positioned to extend through the end spacer 86 at the opposite end of each rod 46 as seen in FIG. 5.

Thus, by properly positioning the spacers on the rods 46 and 47 and securing the same in place as noted, the electrical contact members 76 and 76' may be securely held in operative position on the respective rods. In that regard, when the cam mechanism of the jig holder is in the open position shown in FIGS. 2 and 3, the teeth 81 and 81' of adjacent pairs of contact members are laterally spaced from each other as best seen in FIG. 5. Thus, a gap is provided between such pairs of adjacent contact members so that individual wafers may be positioned in such gaps automatically as wafer carriers 21 are positioned in the pockets in the jig holder provided therefor as described previously. Such teeth 81, 81' also tend to guide the wafers into the respective gaps if any slight wafer misalignment is encountered.

However, it should be understood that as the cam mechanism is actuated by causing the bifurcated camming member 62 to move in the direction of the arrow in FIG. 3, thereby causing the rods 46 to move to the right in such figure, the contact elements 76 carried by rods 46 will move laterally to the right in FIGS. 3 and 5 to bring opposed teeth 81 and 81' of adjacent pairs of contact elements into clamping engagement with wafers interposed therebetween.

In that regard, referring to FIG. 6, it will be noted that, although the respective electrical contact elements 76 and 76' are identical, their orientation on the respective rods 46 and 47 is opposite so that the teeth 81 and 81' of opposed elements are angularly inclined in opposite directions. Such angular inclination further insures the effective cutting through of the photoresist layer carried by a wafer to insure effective electrical contact between the jig holder and the respective elements.

Thus, when the wafers are positioned between the contact elements of the electrical contact structure of the jig holder, and the cam mechanism is actuated, effective current transfer from the electrodes defined by rod 16 and by the jig holder 11 is insured.

Referring to FIGS. 3 and 5, it will further be noted that a spring member, defined by a coil spring 91, is interposed between the side wall 31 and the end spacer 86 mounted on rod 46 as noted. The purpose of such spring members is to insure separation of the contact members from engagement with the wafers when the cam mechanism is moved from the closed position back to the open position.

From the foregoing, it should be understood that a plurality of wafers may be rapidly and readily positioned for electrolytic etching without individual manual handling thereof merely by inserting one or more wafer carriers 21, in which a plurality of wafers have previously been positioned, into the pockets defined by the jig holder as previously described. The spacing of such wafers in the carrier corresponds to the spacing of the gaps provided between the projections on adjacent contact elements of the jig holder so that wafers are positioned between the adjacent projecting biting teeth of adjacent contact elements to be securely engaged thereby in the manner described when the cam mechanism is actuated. The engagement between adjacent biting teeth on individual wafers is such that the teeth securely clamp and hold the wafers in engagement therewith even to the extent that the jig holder may be inverted without wafers dropping from engagement with the jig holder.

As seen in FIGS. 3 and 4, each of the rods 46 and 47, the spacers 86 and 86', and the circular portions 77 and 77' of the contact elements, are surrounded by nonmetallic split sleeves 92, 92' respectively, which are formed from any suitable low friction material, such as Teflon. The purpose of such sleeves, as best seen in FIG. 4, is to preclude damage to the wafers during clamping or unclamping thereof as the cam mechanism is moved between its open and closed positions. That is, the lower edges of the wafers are supported directly by the sleeves 92, 92' as seen in FIG. 4 and such sleeves provide smooth sliding surfaces over which the wafer edges may move without catching during clamping or unclamping thereof. Thus, edge chipping or breaking of the wafers is precluded.

In that regard, referring to FIG. 4, it will be noted that the wafers are moved from their normal carrier supported position shown in dotted lines in FIG. 4 upwardly to the solid line position shown in such figure when the carrier is positioned and supported within the jig holder. Such upward movement of the wafers in the carrier disengages the wafers from the edges of the slots in the carrier so that lateral movement or displacement of the wafers along sleeves 92, 92' may be effected during clamping or unclamping thereof as noted above when the contact members are actuated by the cam mechanism.

While in the embodiment illustrated, the respective contact elements are provided with circular openings 78, 78' therein to surround the respective rods 46 and 47 on which they are mounted, rotation of the contact elements is precluded by means of the secure wedged engagement of the respective contact elements and the spacers engaged therewith. However, if rotation of individual contact elements is encountered in a given installation, the rods 46 and 47 may be provided with a non-circular periphery and the contact elements 76 and 76′ may be similarly provided with non-circular openings 78, 78′ therethrough to preclude any possibility of rotation of the contact elements on the rods during use.

As seen in FIG. 2, an electrical circuit between the jig holder 11 and the control console 7 may be easily made and broken selectively by means provided for completing such electrical circuit. In the embodiment illustrated, such means comprises a female metal conducting member or plug 96 secured to the upright handle member 41. The aforementioned wire 14 connected with console 7 is provided with a male metal conducting clip 97 at its end. Clip 97 is selectively received within plug 96 when electrical connection between the console and the jig holder is desired.

Having thus made a full disclosure of a preferred embodiment of an improved jig holder which insures effective electrolytic etching of articles while facilitating simultaneous insertion of a plurality of such articles into operative contact with the jig holder, reference is directed to the appended claims for the scope of protection to be afforded thereto.

I claim:

1. For use in electrolytic etching of a plurality of wafers or like articles simultaneously in a batch etching procedure, a jig holder for securely clamping a plurality of said wafers in an operative position therein, with each of said wafers being exposed in its entirety to an etching solution, comprising A. positioning means in said holder comprising a pocket for receiving carrier means therein in which a plurality of said wafers are positioned in generally parallel spaced orientation,
   1. said carrier means permitting said plurality of wafers to be inserted into said holder simultaneously so that individual wafer handling is obviated, B. electrical contact structure provided in conjunction with said positioning means for receiving therein said wafers positioned within said carrier means,
   1. said contact structure including a plurality of adjacent pairs of opposed electrical contact members which are normally spaced from each other to define gaps therebetween to receive said wafers therein,
   2. said contact structure projecting into said carrier means when said carrier means is received within said holder positioning means, C. wafer supporting structure adjacent said contact structure for engaging wafer edges to move said wafers out of engagement with said carrier means when said carrier means is received within said holder positioning means so that said contact members may be brought into engagement with said wafers, and D. means for selectively moving said adjacent pairs of said contact members relative to each other to close said gaps therebetween and to clamp said wafers therebetween without covering the wafer surfaces to be etched.

2. In combination, the jig holder of claim 1 and said carrier means positioned in said holder, said carrier means comprising a wafer carrier having
   1. opposed walls having a plurality of aligned slots therein in which said wafers are received, and
   2. an open bottom through which said contact structure and said supporting structure of said holder are positionable for engagement with said wafers when said carrier is positioned within said holder.

3. The jig holder of claim 2 which further includes
   D. means for operatively connecting said holder with a source of electric current for introducing electric current through said contact structure and therethrough into the wafers clamped thereby.

4. The jig holder of claim 3 in which said carrier means is formed from an electrically non-conducting material so that said wafers are insulated from all portions of said holder except said contact structure thereof.

5. The jig holder of claim 3 in which said opposed contact members of said contact structure are formed with cutting projections thereon for insuring effective electrical contact of said contact members with the wafers clamped therebetween without covering the wafer surfaces to be etched.

6. The jig holder of claim 1 in which said means for moving said pairs of contact members relative to each other comprises cam mechanism operatively connected with said contact structure for selectively moving in unison at least one contact member of each adjacent pair of members toward the other member of each such pair when said cam mechanism is moved from an open to a closed position.

7. The jig holder of claim 6 in which said means for moving said pairs of contact members relative to each other further includes at least one spring member for urging in unison each said one member of each said pair away from the other member of each such pair when said cam mechanism is moved from said closed to said open position.

8. The jig holder of claim 3 which further includes
   E. handle structure including an insulated portion by which said holder may be manually grasped when said holder is connected with said source of electric current,
      1. said handle including a conducting member which is in operative engagement with said contact structure,
   F. said means operatively connecting said holder with said source of electric current comprising
      1. a clip member selectively separable from said handle conducting member when said holder is to be operatively separated from said current source.

9. The jig holder of claim 1 in which said positioning means includes at least two pockets for receiving at least two of said wafer carrier means therein, each of said pockets including wafer contact structure in conjunction therewith.

10. For use in an electrolytic etching bath for etching silicon wafers or like articles to be positioned therein, the combination comprising an improved jig holder for securely clamping a plurality of wafers in an operative position therein, and at least one wafer carrier having a plurality of wafers to be etched positioned therein: said carrier comprising A. opposed walls having a plurality of aligned slots therein in which a plurality of wafers are positioned, and B. an open bottom through which said wafers may be engaged with a source of electric current passing through said holder and with supporting structure to move said wafers out of engagement with said carrier means during etching so that said wafers are exposed in their entirety to said etching bath, 1. said carrier means permitting said plurality of wafers to be inserted into said holder simultaneously so that individual wafer handling is obivated; said jig holder comprising C. opposed side walls defining a pocket for receiving and supporting said wafer carrier therein, D. electrical contact structure provided in conjunction with said holder pocket and projecting into said pocket for connecting said wafers with a source of electric current, 1. said contact structure including a plurality of adjacent pairs of opposed electrical contact members which are normally spaced from each other to define gaps therebetween to receive said wafers therein, E. wafer supporting structure adjacent said contact structure for engaging wafer edges to move said wafers out of engagement with said carrier means when said carrier means is received within said holder positioning means so that said contact members may be brought into engagement with said wafers, and F. means for selectively moving said adjacent pairs of said contact members relative to each other to close said gaps therebetween and to clamp said wafers therebetween without covering the wafer surfaces to be etched.

11. The combination of claim 10 which comprises at least two of said wafer carriers, and in which said jig holder includes at least two carrier receiving pockets and wafer contact structure provided in conjunction with each said pocket.

12. The combination of claim 10 in which said jig holder further includes F. means for operatively connecting said holder with a source of electric current for introducing electric current through said contact structure and therethrough into the wafers clamped thereby.

13. The combination of claim 10 in which said carrier is formed from an electrically non-conducting material so that said wafers are insulated from all portions of said holder except said contact structure thereof.

14. The combination of claim 10 in which said opposed contact members of said contact structure are formed with cutting projections thereon for insuring effective electrical contact of said contact members with the wafers clamped therebetween without covering the wafer surfaces to be etched.

15. The combination of claim 10 in which said means for moving said pairs of contact members relative to each other comprises cam mechanism operatively connected with said contact structure for selectively moving in unison at least one contact member of each adjacent pair of members toward the other member of each such pair when said cam mechanism is moved from an open to a closed position.

16. The combination of claim 15 in which said means for moving said pairs of contact members relative to each other further includes at least one spring member for urging in unison each said one member of each said pair away from the other member of each such pair when said cam mechanism is moved from said closed to said open position.

17. The combination of claim 10 in which said jig holder further includes F. handle structure including an insulated portion by which said holder may be manually grasped when said holder is connected with said source of electric current, and G. an electric current conducting member forming part of said handle structure and operatively connected with said contact structure to conduct electric current thereto, H. said means for operatively connecting said holder with said source of electric current comprising 1. a clip member selectively connectable with and separable from said handle conducting member when said holder is to be operatively connected with or separated from said electric current source.

18. The combination of claim 14 in which said cutting projections include inclined edges which extend from the respective contact members at an angle relative to the vertical axes of such members.

19. The combination of claim 18 in which said inclined edges of opposed contact members of said pairs of contact members are inclined in generally opposite directions relative to the vertical axes thereof.

* * * * *